United States Patent
Heim et al.

(10) Patent No.: US 9,927,933 B2
(45) Date of Patent: Mar. 27, 2018

(54) METHOD AND SYSTEM FOR GESTURE DETECTION AND TOUCH DETECTION

(71) Applicant: Microchip Technology Incorporated, Chandler, AZ (US)

(72) Inventors: Axel Heim, Munich (DE); Andreas Dorfner, Munich (DE); Roland Aubauer, Wessling (DE)

(73) Assignee: MICROCHIP TECHNOLOGY GERMANY GMBH, Rosenheim (DE)

(*) Notice: Subject to any disclaimer, the term of this patent is extended or adjusted under 35 U.S.C. 154(b) by 113 days.

(21) Appl. No.: 14/793,525

(22) Filed: Jul. 7, 2015

(65) Prior Publication Data
US 2016/0011692 A1 Jan. 14, 2016

Related U.S. Application Data

(60) Provisional application No. 62/023,061, filed on Jul. 10, 2014.

(51) Int. Cl.
*G06F 3/044* (2006.01)
*G06F 3/01* (2006.01)
*G06F 3/041* (2006.01)

(52) U.S. Cl.
CPC ............. *G06F 3/044* (2013.01); *G06F 3/017* (2013.01); *G06F 3/0416* (2013.01); *G06F 2203/04101* (2013.01); *G06F 2203/04106* (2013.01); *G06F 2203/04108* (2013.01); *G06F 2203/04112* (2013.01)

(58) Field of Classification Search
CPC . G06F 2203/04101; G06F 2203/04106; G06F 2203/04108; G06F 2203/04112; G06F 3/017; G06F 3/0416; G06F 3/044
See application file for complete search history.

(56) References Cited

U.S. PATENT DOCUMENTS

| | | | |
|---|---|---|---|
| 5,512,836 A | 4/1996 | Chen et al. | 324/687 |
| 7,705,834 B2 | 4/2010 | Swedin | 345/174 |
| 8,531,431 B2 | 9/2013 | Swedin | 345/174 |
| 2008/0142352 A1 | 6/2008 | Wright | 200/600 |
| 2008/0246723 A1 | 10/2008 | Baumbach | 345/156 |
| 2009/0089599 A1 | 4/2009 | Westwick et al. | 713/323 |

(Continued)

FOREIGN PATENT DOCUMENTS

| | | | |
|---|---|---|---|
| CA | 2411365 A1 | 6/2004 | G08B 25/08 |
| DE | 202012102989 U1 | 9/2012 | H03K 17/96 |
| EP | 2104023 A2 | 9/2009 | G06F 3/041 |

OTHER PUBLICATIONS

Davison, Burke, "AN1478: mTouch™ Sensing Solution Acquisition Methods Capacitive Voltage Divider," Microchip Technology Incorporated, 28 pages, Oct. 26, 2012.

(Continued)

*Primary Examiner* — Viet Pham
(74) *Attorney, Agent, or Firm* — Slayden Grubert Beard PLLC

(57) ABSTRACT

A system has a gesture detection device with a plurality of input channels and an output channel which uses an alternating electric near field generated through at least one transmission electrode coupled with the output channel, wherein some of the input channels are coupled with receiving electrodes of the gesture detection device. The system further has a plurality of touch electrodes, wherein the touch electrodes are coupled with one of the input channels by multiplexing.

32 Claims, 11 Drawing Sheets

(56) References Cited

U.S. PATENT DOCUMENTS

| | | | |
|---|---|---|---|
| 2009/0315258 A1 | 12/2009 | Wallace et al. | 273/238 |
| 2013/0027015 A1 | 1/2013 | Park | 323/285 |
| 2013/0147833 A1 | 6/2013 | Aubauer et al. | 345/619 |
| 2013/0155630 A1 | 6/2013 | Yilmaz et al. | 361/748 |
| 2014/0049266 A1 | 2/2014 | Heim et al. | 324/603 |
| 2015/0062074 A1 | 3/2015 | Wang et al. | 345/174 |

OTHER PUBLICATIONS

"MGC3130: Single-Zone 3D Tracking and Gesture Controller Data Sheet," Microchip Technology Incorporated, 46 pages, Oct. 28, 2013.

International Search Report and Written Opinion, Application No. PCT/EP2015/065777, 18 pages, dated Nov. 10, 2015.

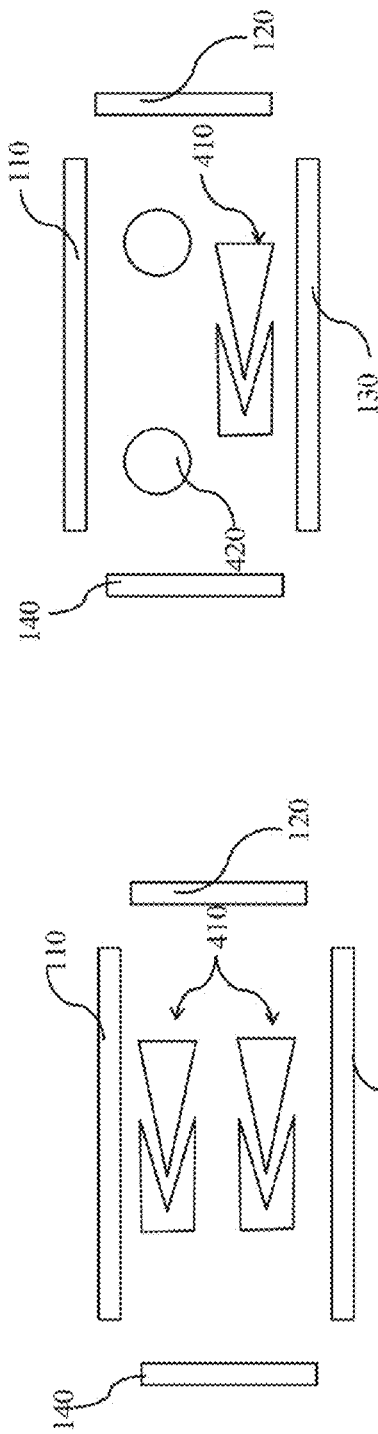
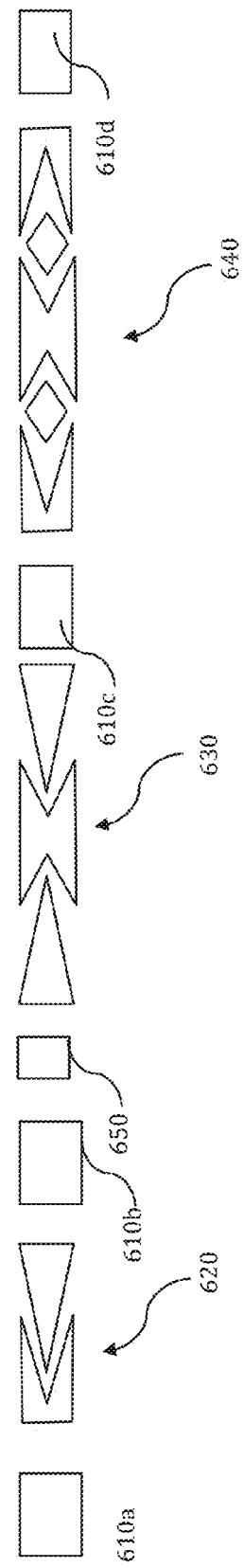

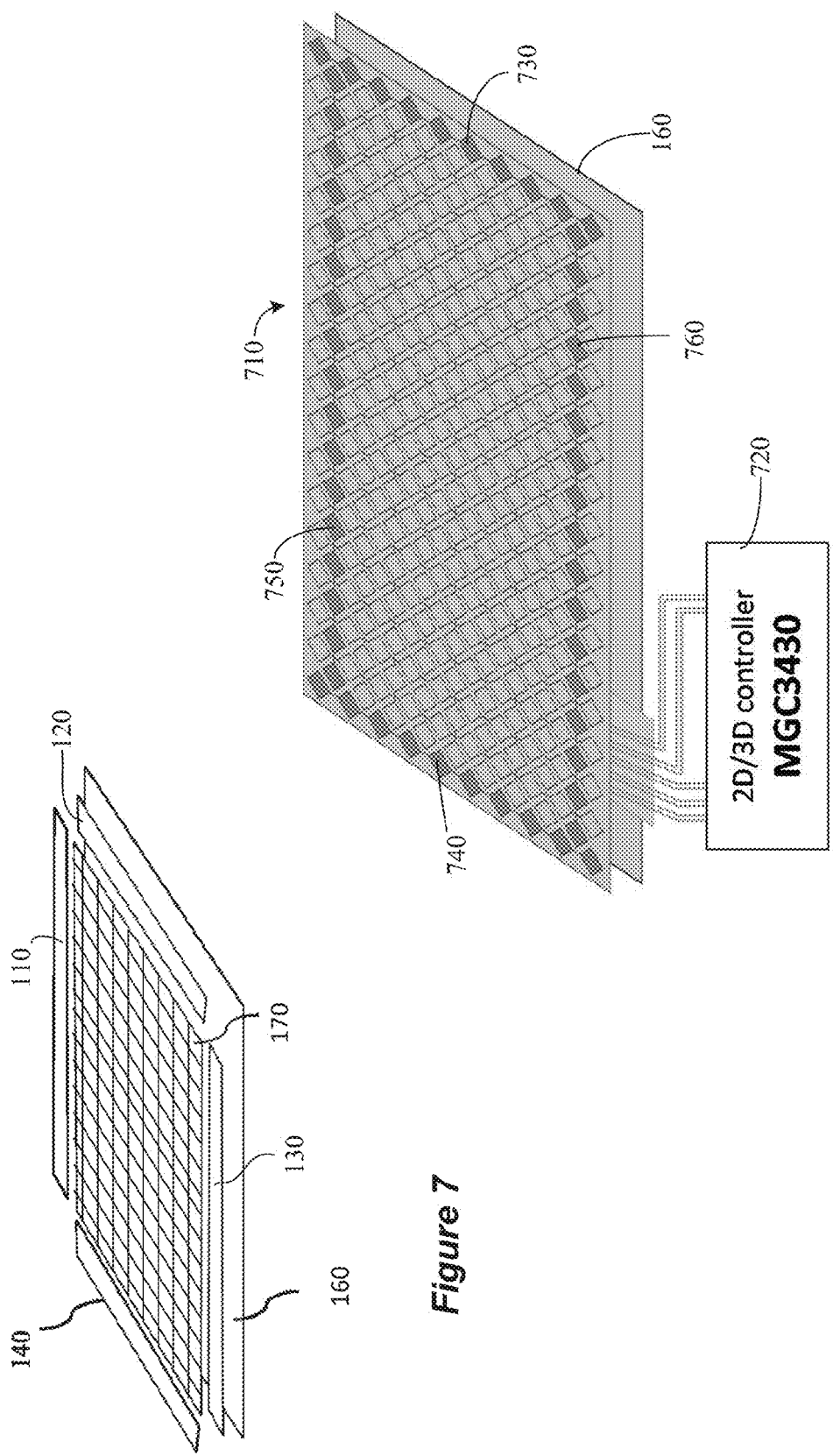

METHOD AND SYSTEM FOR GESTURE DETECTION AND TOUCH DETECTION

RELATED PATENT APPLICATION

This application claims priority to commonly owned U.S. Provisional Patent Application No. 62/023,061 filed Jul. 10, 2014; which is hereby incorporated by reference herein for all purposes.

TECHNICAL FIELD

The present disclosure relates to human device interfaces, in particular to a method and system for gesture detection and touch detection.

BACKGROUND

The "GestIC®" integrated circuit, also known as MGC3130 manufactured by Applicant, is a highly sensitive capacitive sensing technology used for non-touching gesture detection using an alternating electric near field, for example around 100-200 kHz. Human interface devices (HID) using capacitive sensing comprise sensor electrodes that are often formed in layers of conductive material, e.g. stripes of copper of printed circuit board layer (PCB). These electrodes are electrically connected to a gesture detection unit, for example, on the same PCB to form a compact unit. The gesture detection unit's measurement value, among others, depends on the position of a target object (finger/hand) in the sensor electrode's vicinity which influences the capacitive coupling between electrode and target, yielding a target measurement signal depending on the distortion of the alternating electric field. The gestures are performed above a detection area without touching any area of the respective device. In addition, touch detection may also be required for performing/initiating certain functions of the device.

SUMMARY

According to an embodiment, a system may comprise a three-dimensional (3D) gesture detection device with a plurality of input channels and an output channel, wherein the 3D gesture device uses an alternating electric near field generated through at least one transmission electrode coupled with the output channel, wherein some of the input channels are coupled with receiving electrodes of the 3D gesture detection device, the system further comprising a plurality of touch electrodes, wherein at least one of the input channels is coupled to at least one of the plurality of touch electrodes through multiplexing.

According to a further embodiment, multiplexing can be time multiplexing with a time division multiple access scheme. According to a further embodiment, the TDMA mode may comprise different sub-modes comprising scheduled controlled, event-based controlled or carrier-sensing TDMA. According to a further embodiment, the gesture detection device may comprise a controller comprising one or more receiving multiplexers coupled with the touch electrodes and controlled to perform said multiplexing. According to a further embodiment, the gesture detection device may comprise a controller having general purpose input/output pins and the system further comprises one or more receiving multiplexers coupled with the touch electrodes and controlled through the general purpose I/O pins of the gesture detection system to couple one of the touch electrodes with one of the input channels. According to a further embodiment, the gesture detection device may comprise five input channels and wherein four input channels are connected to four receiving electrodes and the fifth input channel is coupled with an output of the receiving multiplexer. According to a further embodiment, the system may comprise a fifth receiving electrode coupled with one the receiving multiplexer inputs. According to a further embodiment, the gesture detection device may comprise a controller having general purpose input/output pins (GPIOs) and the further system comprising one or more discrete transmission multiplexers coupled with the gesture detection device which are controlled by GPIOs. According to a further embodiment, the gesture detection device may comprise a controller having general purpose input/output pins (GPIOs) and the system comprising one or more discrete analog multiplexers and one or more discrete digital multiplexers each coupled with the gesture detection device which are controlled by GPIOs. According to a further embodiment, the system may further comprise a plurality of transmission electrodes wherein the controller comprises one output channel coupled with an input of the digital multiplexer, wherein the transmission electrodes are coupled with outputs of the digital multiplexer, and wherein the touch electrodes are coupled with inputs of the analog multiplexers. According to a further embodiment, the touch electrodes may comprise one or more touch button electrodes. According to a further embodiment, the touch electrodes may comprise one or more touch segment electrodes arranged to form a slider electrode. According to a further embodiment, the receiving electrodes and the touch electrodes can be arranged along a straight line. According to a further embodiment, the receiving electrodes and the touch electrodes can be formed by electrode segments of touch detection electrode grid. According to a further embodiment, the touch electrodes can be formed by electrode segments of touch detection electrode grid and the receiving electrodes are arranged around the touch detection electrode grid. According to a further embodiment, the touch electrode grid may comprise electrode segments arranged in a single layer. According to a further embodiment, the touch electrode grid may comprise electrode segments arranged in a single layer. According to a further embodiment, a touch electrode can be arranged above a transmission electrode. According to a further embodiment, a touch electrode can be arranged in the same layer as an associated transmission electrode and adjacent to the associated transmission electrode. According to a further embodiment, a touch electrode can be arranged under a transmission electrode. According to a further embodiment, the transmission electrode can be a meshed electrode. According to a further embodiment, the receiving electrodes can be arranged in the same layer as the meshed transmission electrode. According to a further embodiment, the system may further comprise an additional transmission electrode arranged under the receiving electrodes. According to a further embodiment, a touch electrode may comprise a first segment is arranged in the same layer as an associated transmission electrode and a second segment arranged under the transmission electrode.

According to yet another embodiment, a system may comprise a three-dimensional (3D) gesture detection device with a plurality of input channels and an output channel, wherein the 3D gesture device uses an alternating electric near field generated through at least one transmission electrode coupled with the output channel, wherein some of the input channels are coupled with receiving electrodes of the 3D gesture detection device, the system further comprising a plurality of transmitting touch electrodes associated with a receiving touch electrode coupled with an input channel, wherein the output channel is coupled with at least one of the plurality of transmitting touch electrodes through multiplexing.

According to another embodiment of the above system, the gesture detection device may comprise a controller having general purpose input/output pins (GPIOs) and the system further comprises one or more discrete transmission multiplexers coupled with the gesture detection device which are controlled by the GPIOs. According to another embodiment of the above system, the transmission multiplexer is a digital multiplexer. According to another embodiment of the above system, the gesture detection device may comprise one or more internal transmission multiplexers.

According to another embodiment, a method for operating a three-dimensional (3D) gesture detection device using an alternating electric near field and comprising at least one transmission electrode and a plurality of input channels, may comprise the steps of coupling some of the input channels with receiving electrodes of the 3D gesture detection device, and multiplexing a plurality of touch electrodes using a multiplexer, wherein the multiplexer is controlled to couple at least one selected touch electrode with a remaining one of the plurality of input channels.

According to a further embodiment, multiplexing can be time multiplexing with a time division multiple access scheme. According to a further embodiment, the TDMA mode may comprise different sub-modes comprising scheduled controlled, event-based controlled or carrier-sensing TDMA. According to a further embodiment, the touch electrodes may comprise one or more touch segment electrodes arranged to form a slider electrode. According to a further embodiment, the receiving electrodes and the touch electrodes can be arranged along a straight line.

BRIEF DESCRIPTION OF THE DRAWINGS

FIG. 4 shows a four-electrode GestIC® frame with sliders.

FIG. 5 shows a four-electrode GestIC® frame with buttons and slider

FIG. 6 shows a line of four GestIC® electrodes with buttons and sliders.

FIG. 7 shows a four-electrode GestIC® frame with 2D touch grid.

FIG. 8 shows a conventional 2D touch design with four preferred electrodes.

DETAILED DESCRIPTION

Figure 1:
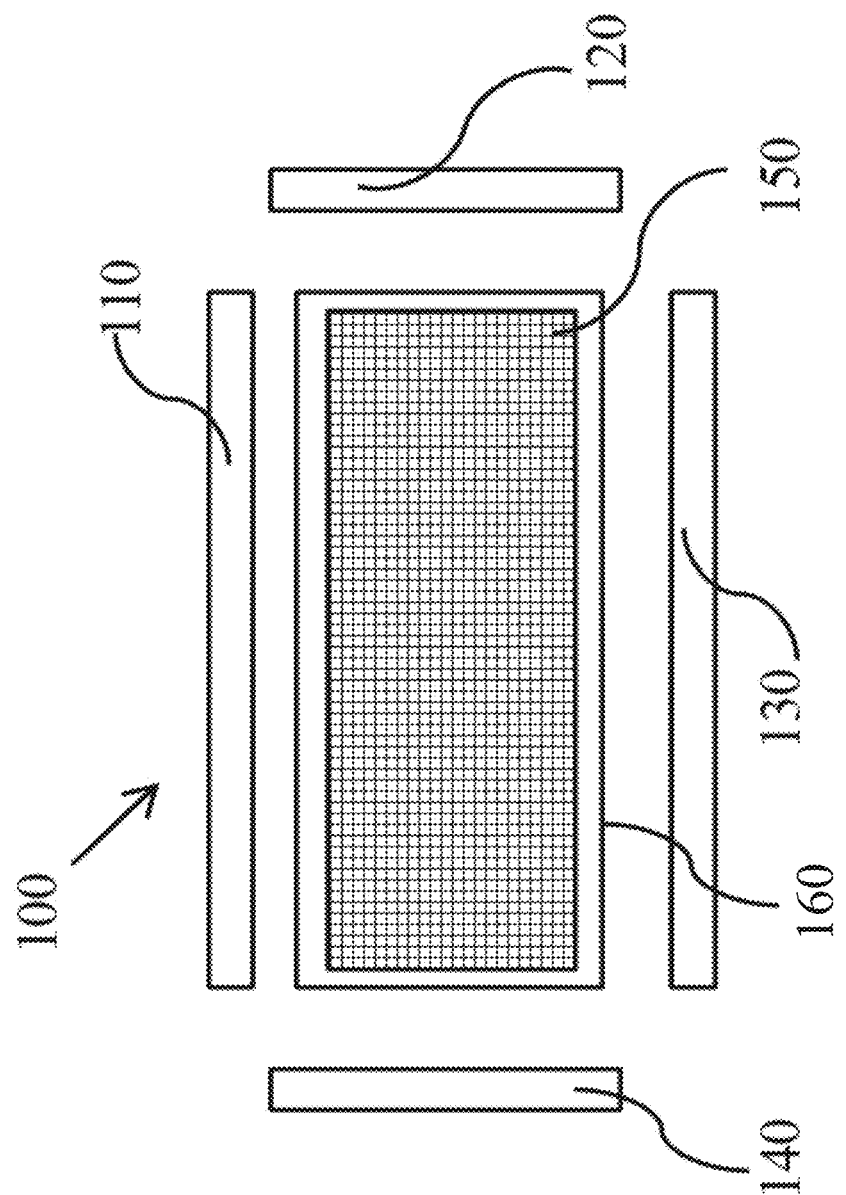
FIG. 1 shows four frame electrodes for 3D detection with conventional 2D touch grid and large electrode underneath to detect touches during 3D operation.

According to various embodiments, an alternating near field capacitive gesture detection device can be operated by applying a different method of capacitive sensing than the one commonly applied for touch detection—and therefore such a gesture detection method can just as well be used for touch detection.

According to various embodiments, setup and operation of a capacitive sensor system for 3D gesture recognition and position tracking, as well as touch detection can be provided. Touch detection in this manner could employ a button, slider, or 2D touch panel sensor.

The problem is that, in a system as previously described, there is one physical E-field only and hence the E-field excitations of different systems can mutually interfere. Further, an E-field sensor using an alternating electric near-field is highly sensitive such that changes of couplings in the capacitive network even in the Picofarad range distort 3D measurements.

Conventional methods for 3D sensing, for example, as published in US patent application publication US2014/0049266 which is hereby incorporated by reference in its entirety, and capacitive touch sensing, e.g. Capacitive Voltage Divider (CVD), cf. for example Microchip's application note AN1478 which is hereby incorporated by reference in its entirety, disturb each other's sensor signal in a way that cannot (easily) be compensated for. For example, in CVD, the Rx electrodes' electrical potential is repeatedly switched to Vdd or GND, followed by a floating state where electrical charge is equalized with another capacitor. These transitions of capacitances, electric potentials and charge equalizations can affect the surrounding electric field (E-field) in such a way that simultaneous operation of both systems is not easily possible.

Touch detection on GestIC® electrodes has been introduced in Microchip's GestIC® Library v1.0, the number of touch areas being limited by the number of five GestIC® electrodes. The following description will refer to the GestIC® system for a touchless 3D detection system. However, the disclosed teaching may apply to any other detection system that uses an alternating electric near field and is therefore not limited to the GestIC® system and its associated electrodes.

According to various embodiments, the transmit signals for 3D and touch detection can be synchronized, and the touch detection system's transmit signal paths can be adapted such that the touch system's interference onto, for example, GestIC® received signals becomes deterministic and can be sufficiently compensated for on runtime.

There are two general approaches for joint operation of 3D and touch detection systems: Multiplexing, i.e. separation of the systems' shared transmission channel in order to minimize mutual interference, and Interference Compensation.

Typically, due to higher sensitivity of an alternating electric near field 3D detection system, the touch detection system's interference onto the former is the critical one, and hence the focus of this application.

1. Multiple Access (MA)

According to communication theory, interference between transmission channels can be suppressed or even eliminated when applying multiple access schemes in order to multiplex different transmit signals on single shared physical channel, thus creating multiple logical sub-channels.

a. Space Division Multiple Access (SDMA)

When two or more capacitive sensor systems are placed sufficiently far apart from each other, i.e. when they are separated in space, the systems can be assumed to not share the same transmission channel—but to have independent channels—and the mutual interference can be neglected, or it can be considered and dealt with as noise.

Co-pending application "System and Method for Gesture Control", filed Jan. 13, 2015, application Ser. No. 14/596,120, which is hereby incorporated by reference in its entirety, presents such a joint system where four GestIC® 'frame' electrodes are located around a 2D touch pad like a ring.

b. Time Division Multiple Access (TDMA)

In order to avoid the problems arising with simultaneous operation of systems being located closely together, time division multiple access can be applied, i.e. at any time either 3D sensing using the GestIC® method, or capacitive touch sensing, e.g. using the CVD, method is applied. Several new problems/challenges arise with this approach: While one system is active, the other one may miss user activity. Noise: Noise suppression is limited when not continuously sampling the signal levels. This is particularly important with electrodes for 3D sensing where the signal-to-noise ratios (SNRs) are typically small. Calibration: In order to be able to follow signal drifts (e.g. due to temperature change, mechanical deformation, electrical influences), both systems must be active in regular intervals and adapt detection thresholds and signal offsets. The need for calibration and the risk of missing user activity limit the maximum time of switching between measurement methods. Transient effects: Switching between different measurement methods can cause transient effects on the signal levels, e.g. due to charge changes on floating electrodes. Pre-charging of the corresponding electrodes to a desired electrical potential can reduce this effect. Transient effects limit the minimum time of switching between systems. There are several sub-modes of TDMA:

i. Scheduled TDMA

The most common approach for TDMA is on a scheduled basis, i.e. the time slot of activity of each measurement system before switching to the other one is pre-defined or scheduled, and activation typically happens in a cyclically repetitive frame structure.

ii. Event-Based TDMA

Another approach is event-based TDMA: For example with 3D sensing being the default method, it is switched to touch sensing when a touch is detected, and it is switched back to 3D sensing after no more touch is detected. However, this implicitly demands touch detection while in 3D mode. The following example illustrates how this can be done by using capacitive coupling of the electrodes used for touch detection, and a special electrode input to the 3D sensing chip (MGC3130).

FIG. 1 shows a conventional sensor system 100 which can be used for an event-based time-division multiple access. The system comprises four receiving electrodes 110, 120, 130, and 140 arranged in a frame for 3D detection with a conventional 2D touch grid 150 and a large transmission electrode 160 underneath to detect touches during 3D operation.

A Microchip MGC3130 micro-controller (µC) (not shown) can be used for 3D sensing, and a PIC microcontroller, or any other suitable microcontroller (not shown) can be used for touch detection on the rectangular touch grid 150 doing projected capacitance (pCap) measurements, e.g. using the Capacitive Voltage Divider (CVD) method. Four of the MGC3130's five Rx channels are connected to four frame electrodes 110, 120, 130, 140 around the touch grid 150. The fifth Rx channel is connected to a large, typically hedged electrode 160 underneath the touch grid 150. Upon a touch event, when the MGC3130 is active, the rise of its signal level needs to be quickly detected, as activity needs to be handed over to the PIC microcontroller which needs to perform touch scans to verify and locate the touch and its position. Hence, the signal used for touch detection in MGC3130 cannot be filtered through a standard low-pass filter with a step response of 50 ms, as by the time the PIC microcontroller would be active, a short touch event can already have passed. This issue is solved in co-pending application "Touch Detection in a Capacitive Sensor System", field provisionally Apr. 17, 2014, application No. 61/981,140, and which is hereby incorporated by reference in its entirety, where a Low-Latency Touch Detection algorithm is proposed. Still, the minimum touch time is still larger than with the PIC operating in stand-alone system without 3D detection.

These difficulties require for a quick hand-over between the two micro-controllers. Another drawback of this approach is the redundancy of the touch detection algorithms in MGC3130 and the PIC microcontroller which is an overhead of flash memory requirements. GestIC® 3D operation is interrupted in regular intervals when no activity is detected to allow calibration measurements of the PIC microcontroller.

Despite the reduced number of switches between 2D and 3D sensing as compared to a scheduled multiplexing scheme, the signal transients after switching from 2D to 3D can be of significant duration (>1 s). Driving the pCap Tx lines with the GestIC® Tx signal does significantly reduce this transient time (to a few milliseconds) as it reduces the effect of floating lines with a gradual (dis-) charge drift, at the cost of lower sensitivity for touch detection.

Another drawback of the two-chip solution is the necessity of two micro-controllers by definition—and these microcontrollers will always need to be synchronized in some way.

iii. Controlled TDMA

One system, the Master, controls when each of the systems is activated. For example, the touch controller signals to the 3D-gesture controller when it is idle and when it is performing touch scans, and the 3D-gesture controller has to act accordingly, i.e. doing 3D-gesture measurements when the touch controller is idle. If 3D-gesture measurements do not interfere the touch measurements, 3D-gesture measurement can also be continuously performed. Then, at times when the touch controller is active, the acquired 3D-gesture measurement data needs to be ignored or considered as noise.

iv. Carrier-Sensing TDMA

Similar to Controlled TDMA, but not requiring a means of signaling between the two systems. For example, when the 3D detection system can sense activity or scans of the touch controller. With MGC3130, for example, this could be done by capacitive or resistive coupling of a receive channel to the touch system's transmission electrodes and evaluating the corresponding received signal e.g. with respect to its signal variance.

c. Frequency-Division Multiple Access (FDMA)

Two or more systems are operated at different frequencies.

Due to limited band-pass filtering of the received signals in GestIC® sensors, the frequency spectra of other sensor systems are likely to not be sufficiently separated from the GestIC® spectrum, but rather overlap. Hence this is a non-preferred solution.

d. Code-Division Multiple Access (CDMA)

Code-Division Multiple Access is a spread spectrum technique which allows systems to operate simultaneously in time.

2. Interference Compensation

In contrast to the multiplexing solutions with Multiple-Access schemes, with this approach the impact of the other sensor system's operation onto received sensor signals is compensated, for example, by means of calibration. This requires at each time the full knowledge of this impact, or at least to a sufficient extend.

The acquisition of such knowledge—which typically is system dependent and happens prior to the actual measurement—can be simplified, for example, when synchronizing the Tx signal for 3D and Touch detection, or even using the same Tx signal for both.

The approach of Interference Compensation is described in more detail below. In contrast to the above mentioned multiplexing solutions, both 3D and touch detection system are assumed to be running simultaneously on the same logical (sub-)channel.

The core solution for this approach is a) to operate the 2D touch detection in a mode such that the interfering impact onto received signals from a 3D-gesture system, e.g. the GestIC® system, can be sufficiently compensated for. This can, for example, be accomplished by using the same E-field excitation, i.e. the same Tx signal, for example a rectangular pulse train, both for 3D and capacitive touch measurements, cf. detection of touches on GestIC® electrodes in Section XIII.

b) to multiplex physical electrodes in order to increase the number of (virtual) sub-channels, thus to increase the local resolution of the touch events. Therefore, two multiplexing schemes are proposed: Time-multiplexing, e.g. using an integrated or a discrete multiplexer (MUX), and mode-multiplexing by exploiting that depending on the electrode design, either absorption mode or transmission mode is dominant, and the direction of the measurement signal's deviation upon touch is depending of this dominant mode (negative or respectively positive signal deviation for a touch event).

c) for the Rx channels used with time-multiplexing, to use individual Rx attenuators (see below in 'Tuning of Rx Attenuators') for each sub-channel to adapt to the capacitive network for each sub-channel (needed in combination with differential PGAs in the GestIC® Rx paths). These attenuation parameters can be obtained automatically during an a priori configuration program, e.g. as an extended version of today's Aurea's (v1.0, v1.1) analog frontend parameterization.

d) to digitally compensate for signal jumps—particularly on sensitive GestIC® channels—caused by changes of the capacitive coupling, i.e. the capacitive network, upon multiplexer switching, by means of baselining using, for example, a priori computed offset values, possibly in an automatized way.

It will be assumed that a significant amount of GestIC® digital signal processing is happening at a decimated (i.e. low-pass filtered and down-sampled) sampling frequency of, for example, 1 kHz. For simplicity and in order to minimize the number of different signal offsets becoming necessary in order to compensate for effects caused by the touch detection using multiplexers, it is advantageous a) to cycle over all desired touch sub-channels of the multiplexer (possibly multiple times) within 1 ms, so to say averaging over the impact on the GestIC® signal due to capacitive and E-field changes, such that this impact is equal for all such 1 ms samples can be assumed to be negligible in subsequent processing stages (there is no multiplexer-state-dependent offset to compensate for), AND/OR b) to cycle over the multiplexer states in such a way that the impact onto the 1 ms samples periodically repeats, and to determine and store this impact for each of the 1 ms samples within such a period as a baseline value, and to use this baseline value later on runtime for signal level compensation. For example, the multiplexer state can be changed every 1 ms.

Preferably, according to various embodiments, both 3D and touch detection are operated using the same controller in order to avoid signaling effort and/or delays between two or more controllers. Key advantages of a single-microcontroller system according to the above items are:

Increased noise robustness due to continuous sampling on preferred electrodes (no time-multiplexing for GestIC® required)

Central Control: Only one 'intelligent' chip, no need for synchronization or hand-over between different microcontrollers necessary Customer-friendly & Simple: Parameterization Wizard 'Aurea' can be adapted to support parameterization for multiplexed sub-channels, e.g. touch threshold parameterization, hence parameterizable black-box firmware is feasible Single Sensor Technology->No Tx signal interference For touch detection, there is a preferred mode and a less preferred mode of operation with respect to their impact onto the generated E-field of the GestIC® received signals:

Time-Multiplexed Received Signal

A preferred mode according to various embodiments may be to continuously sample on the preferred electrodes for 3D detection—typically four electrodes in a frame layout—for increased noise robustness with the low-SNR 3D detection, and to multiplex the receive electrodes for touch detection (non-preferred electrodes) in a scheduled manner onto one or more receive channels. Unused Rx electrodes, i.e. electrodes currently not addressed by the MUX, are typically put to high impedance (e.g. 1 MOhm) biased state in order not to influence the E-filed excited by the signal on the Tx electrode(s). This is the preferred mode as with it the multiplexing theoretically has no influence onto the E-field.

Moreover, according to some embodiments, the preferred electrodes can typically get a higher fraction of time than the non-preferred electrodes. Various arrangement can be used to multiplex the preferred and/or non-preferred electrodes. For example, a 3D gesture detection device may include a plurality of internal analog-to-digital converters (ADC) wherein the preferred 3D electrodes are each assigned to a dedicated ADC without multiplexing and only one or more remaining ADC will be used for the non-preferred touch electrodes, for example using multiplexing which may be performed using an internal multiplexer or an external multiplexer. Other embodiments, may also use multiplexing for the preferred electrodes, preferably through an internal multiplexer. Thus, according to one embodiment, a 3D gesture detection device may include no internal multiplexers and a plurality of input channels each having a dedicated ADC wherein each 3D electrode is connected to one input channel and touch electrodes are multiplexed to one or more remaining ADCs using an external multiplexer. According to another embodiment, a 3D gesture detection device may include a plurality of ADCs each having a dedicated input multiplexer. According to yet another embodiment, a 3D detection device may include a combination of the above, e.g. some ADCs without and some ADC with an associated multiplexer.

The sampling time for each selected channel can varied to allow for more sampling period assigned to the preferred 3D electrodes. For example, in an embodiment of a 3D gesture detection device with five input channels each associated with its own ADC (no internal multiplexing) the four 3D electrodes are not multiplexed at all and an external multiplexer is used for the remaining ADC to be coupled with one of the non-preferred electrodes. In an embodiment using an internal 5:1 multiplexer and only a single ADC within the 3D detection device, four input channels of the multiplexer could be coupled with the four preferred electrodes and the remaining input channel could be assigned to a plurality of touch electrode through an external multiplexer. In such an embodiment, the multiplexer may sample equally through the five input channels, wherein in every sampling round each preferred electrode would be scanned once and only one of the non-preferred electrodes would be scanned per sampling round. In an embodiment with a plurality of internal ADCs, for example five ADCs, each ADC also comprises an associated internal multiplexer. The first input of each multiplexer could be coupled with a preferred 3D detection electrode and the remaining inputs could be coupled with a plurality of touch electrodes, respectively. The channel time could be assigned through the multiplexers such that over time, the preferred electrodes are predominantly scanned. Any kind of scanning ratio can be applied in either embodiment using only an internal or a combination of internal and external mutliplexers. A sampling scheme can be dynamic and vary, for example if the system detects no proximity close enough to anticipate a touch, only preferred electrodes are scanned. The scanning ratio between 3D electrodes and touch electrode can be changed depending on a detected proximity and may increase with respect to the scanning of the touch electrodes if an object gets closer to a detection surface. Other criteria may be used to change the ratio or a fixed ratio may be used in certain applications.

Example: MGC3130 GestIC® Controller With External Analog Multiplexer

Figure 2A:
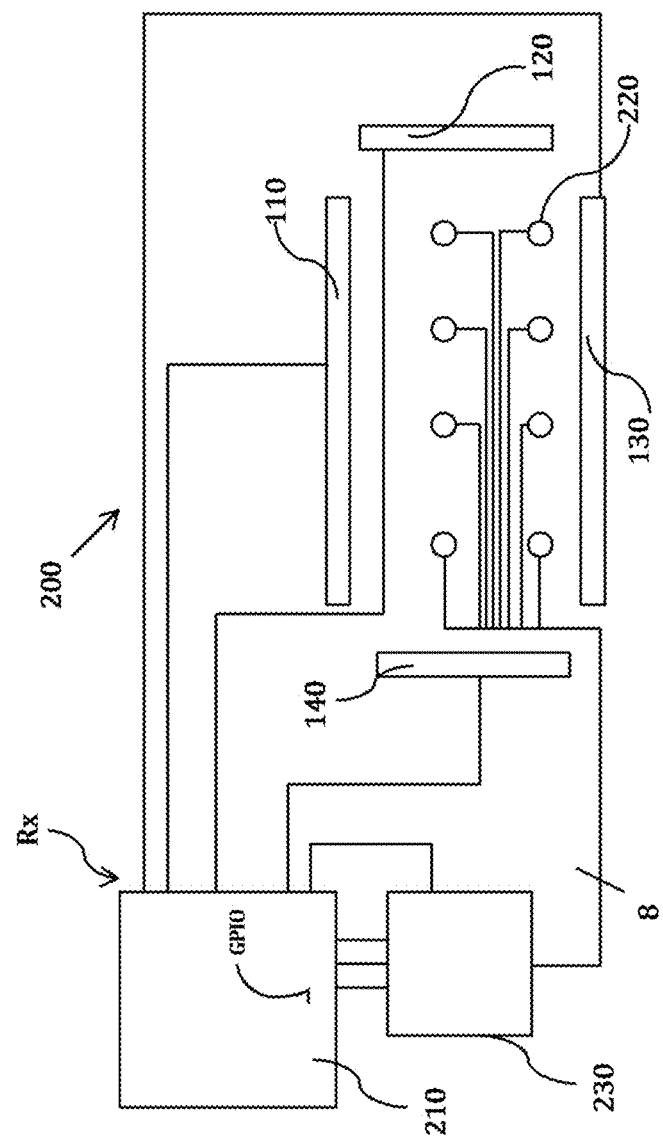
FIGS. 2A and 2B show four GestIC® Rx electrodes in a preferred arrangement and eight buttons multiplexed onto the MGC3130's fifth Rx channel by an analog multiplexer (MUX).
Figure 2B:
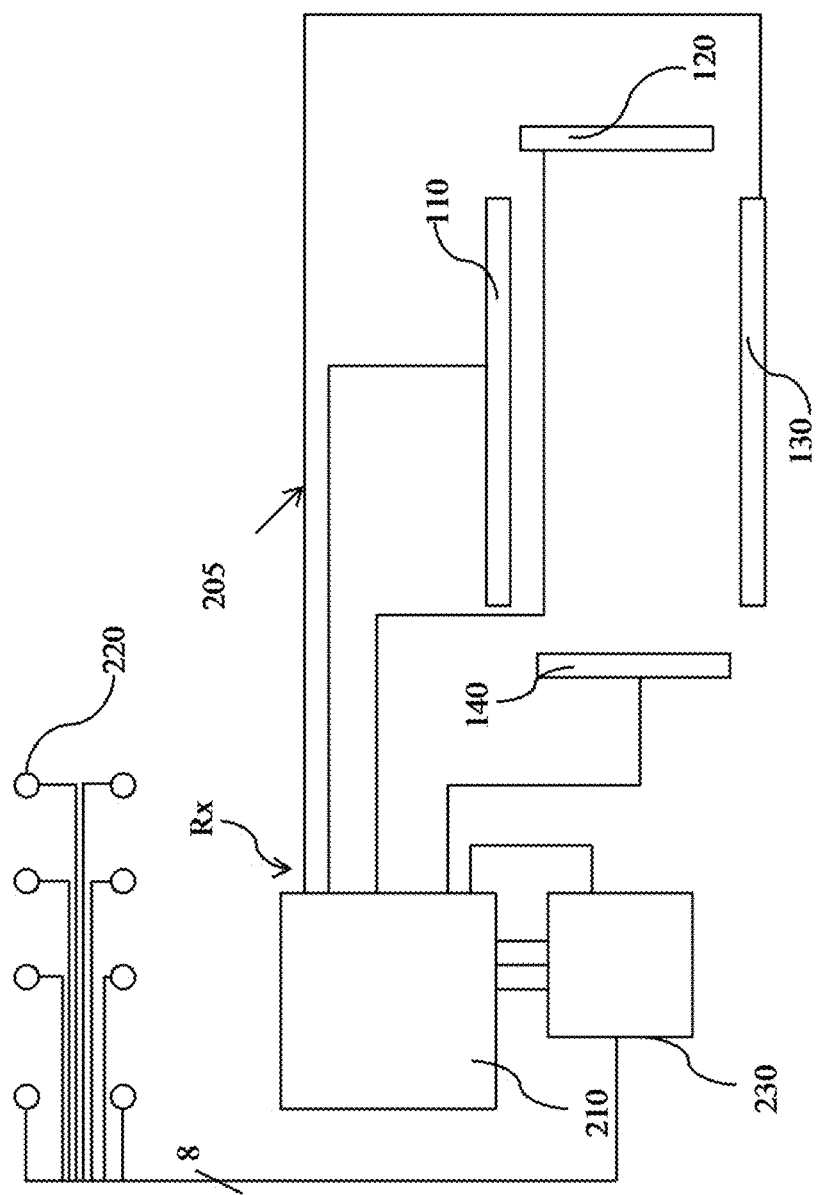

The MGC3130 integrated circuit controller manufactured by the Assignee of this application has 5 Rx channels and associated electrodes 110-150, four of which are typically positioned in a frame shape as shown in FIG. 1 and are used for gesture recognition (e.g. flicks and AirWheel) and coarse x/y positioning in 3D (i.e. without touch). The fifth Rx 150 channel can be used for Approach Detection and Touch Detection, whereas for the latter the provided (x,y) touch position typically is of low precision as it is computed from the four frame electrodes' signal which are typically distorted upon a touch. The MGC3130 has a total of five general purpose input/outputs (GPIOs) available for controlling an external analog MUX (the remaining 3 GPIOs are reserved for I2C communication to a host controller), hence a maximum of $2^5=32$ sub-channels can be addressed with the multiplexer, mapping touch electrodes onto its 5th receive channel. FIGS. 2A and B show two example sensor electrode layouts 200 and 205 with four 'preferred' frame electrodes 110, 120, 130, 140 connected directly to four of the evaluation device 210, for example an MGC3130 with five Rx channels, and eight capacitive touch buttons 220 connected to the input of an analog multiplexer 230, whose output is connected to the 5th MGC3130 Rx channel, and which is controlled by the MGC3130 using 3 of its 5 available General Purpose Input/Output (GPIO) ports. Frame electrodes 110-140 and buttons 220 are placed on the top layer of a printed circuit board (PCB), feeding lines are routed in a middle layer. The bottom layer underneath all frame electrodes and buttons is a large, solid or hedged transmitter (Tx) electrode exciting an E-field. FIGS. 2A and 2B do not show such a transmission electrode which as mentioned is generally arranged in a layer below the receiving electrodes. The following exemplary multiplexers (analog) may be used: ADG708 (8:1), 74HC4051 (8:1), 74HC4067 (16:1). However, other multiplexers may also be suitable.

Figure 3:
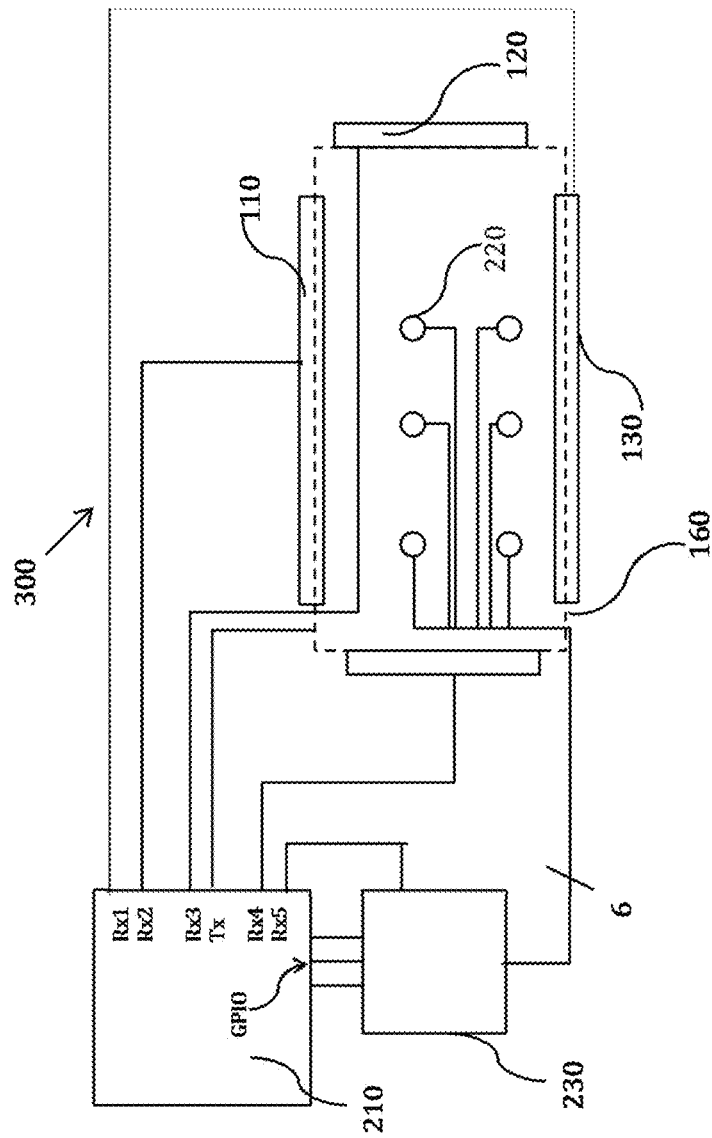
FIG. 3 shows a four-electrode GestIC® frame with buttons.

FIG. 3 shows the setup of FIG. 2 in a very simplified version, showing the Tx electrode 160 in a bottom layer and six touch buttons 220 as well as the frame receiving electrodes 110-140. Multiplexer 230 couples one of the six button electrodes 220 with the fifth electrode input Rx5 of the GestIC® chip 210.

FIG. 4 shows a modified version of the electrodes of FIG. 3, where the touch buttons are replaced by two pairs of slider electrodes 410. A slider electrode 410 setup allows not only the detection of a binary touch event, but also estimating a touching finger's 1D position along the slider's axis, given the signal levels of all slider electrodes.

FIG. 5 shows a variant with both touch electrodes 420 and slider electrodes 410. FIG. 6 shows a variant where the preferred electrodes 610a, b, c, d are placed in a line with buttons 650 and sliders 620, 630, 640 in between. The middle slider 630 setup consist of 3 electrodes, the right slider 640 setup consists of 5 electrodes. The more electrodes contained in a slider setup, the higher the possible resolution of the position estimate. The Tx bottom layer is omitted for simplicity in FIGS. 4-6.

Algorithm/Software

TUNING OF RX ATTENUATORS. The GestIC® Tx signal principally is a low-pass filtered rectangular pulse train, and the Rx signal is an amplitude modulated (AM) version of it, where the modulation reflects the capacitive changes in the system's and its environment's capacitive network. A core feature of the GestIC® analog frontend (AFE) is that in the received signal path an attenuated version of the Tx signal is subtracted from the received signal, and the resulting difference is input to an amplifier. As the useful information is contained in this difference signal, the amplifier is used to increase or adapt its dynamic range to the input range of the analog-to-digital converter (ADC), and hence the signal resolution is increased. The attenuator value is chosen such that the (amplified) difference signal lies within the ADC's input range. For example, it can be chosen such that the difference signal is zero when there is no finger or hand in the system's vicinity. This is done automatically by Microchip's Aurea software for all five Rx channels when performing AFE auto-parameterization. As a channel's signal level is not fully independent of the other channels' attenuators, an iterative algorithm is used to find optimum attenuator values for all channels. When having one or more multiplexed Rx channels, the optimum attenuator values would be obtained when matching the signal values for all multiplexer states individually, and to apply the obtained attenuator values on runtime accordingly, i.e. to update all attenuators upon every multiplexer state change. However, as a signal level's dependence from other channels' attenuators typically is sufficiently small, it is usually sufficient to first do the attenuator matching for one multiplexer state to obtain a base setting for all channels' attenuators, and then, successively for each channel with multiplexed electrodes, loop over all sub-channels and optimize this channel's attenuator for best signal matching, while leaving the other attenuators at their base settings. Generally, tuning of the Rx attenuators can be considered as a coarse form of analog calibration.

BASELINING. Finer calibration typically needs to be done in the digital domain, and typically for all multiplexer states individually. However, this usually simplifies as the change of signal levels upon a multiplexer state change is typically invariant over time for a given system setup. That is, given reference baseline values for a certain multiplexer state, the baselines for the other states differ by delta values from the reference values, and these delta values do not change over time, e.g. due to temperature drifts. Hence, the delta values are system dependent and can be measured and stored a priori by iterating over all multiplexer states. This can be done automatically, for example after determining the attenuator values during Aurea's AFE auto-parameterization.

TOUCH DETECTION. A straight forward approach for touch detection on time-multiplexed channels is to loop over all sub-channels in time intervals of duration T. During each such interval measurement data is acquired, discarding samples suffering from transient effects, and at the interval's end the remaining data is combined to a single output value in a way to optimize noise robustness. The output value is then compared to one or more touch detection thresholds. If a threshold is exceeded in positive or negative direction, a touch event is output. Thresholds will need to be adapted according to signal levels when there is not touch ('baselining').

Example: The switching time of MGC3130's GPIOs—and hence the switching of the multiplexer state—is synchronized to the beginning of each 5 ms GestIC® time window. Internally, demodulated and down-sampled GestIC® measurements are available at typically 1 kHz=1/1 ms, being output of typically an order M=2 Cascaded Integrator Comb (CIC) filter. Combining the 2nd, 3rd, 4th and 5th sample in the 5 ms slot, an estimate for the touch signal level is given. Depending on delay of the MUX switching and other transient times, the 2nd 1 ms may need to be disregarded, too. After each 5 ms window the GPIOs switch the MUX to the next touch sub-channel.

Binary Search Algorithm: Iterating over the touch electrodes implicitly defines the maximum delay for detecting a touch as approximately the time of a whole cycle. In a variant of the algorithm, the detection of a touch on a button can be speeded up and made more noise robust (due to increased sampling time) when the multiplexer allows short-circuiting all touch electrodes, as well as sub-sets of these: Until a touch is detected, all touch electrodes and the MUX output are short-circuited. Then, when a touch has been detected but it is still not clear which electrode has been touched, half of the electrodes and the MUX output are short-circuited to check if the touched button is in this set of electrodes. Depending of the outcome of this check, the current or the other half of electrodes is split into two once more and the process continues until only one button is left, on which the button press is confirmed once more. This algorithm is limited to the detection of a single-button touch and may require a number of different touch detection signal thresholds, one for each set of electrodes being short-circuited.

2D Touch Designs

FIG. 7 shows the principle electrode layout of a standard example 2D touch panel or touch display 710 with horizontal and vertical electrodes. Around the touch grid, four GestIC® electrodes 110-140 are placed in a frame style. Underneath all of these electrodes, in a bottom layer, a large GestIC® Tx electrode 160 is located. With the frame electrodes 110-140, standard 3D GestIC® processing is done. The inner (vertical and horizontal) electrodes 710 of the 2D grid are multiplexed onto the 5th GestIC® Rx channel. With the inner electrodes 710 of the 2D grid, a continuous estimate of a touching finger's x/y position can be obtained. When operated in GestIC® mode, i.e. with E-field excitation by putting the GestIC® Tx signal onto the Tx electrode 160, the Rx electrodes of the 2D grid are scanned in a multiplex scheme as described above. One electrode is connected to MGC3130 Rx input in a time, or a set of short-circuited electrodes, the other electrodes of the 2D grid are set to a defined electrical potential or are high impedance. High impedance electrodes will improve the distribution of the E-field excited by Tx electrode 160. In this mode the mutual-capacitance between Tx electrode 160 and selected 2D electrode is measured as well as the self-capacitance from the selected 2D electrode against ground. Both measurement principals have an impact on the overall signal shift during a touch event. A position estimate can be obtained by applying standard signal processing algorithms as they are applied to touch pads with self-capacitance measurements. Multi-touch positioning is also possible, but will result in so-called ghost points, i.e. for example in the case of two touches, the two 1D estimates x1 and x2 in x-direction cannot be uniquely mapped to the two 1D estimates y1 and y2 in y-direction. However, features like 2-finger pinch-to-zoom are functional despite the presence of ghost points, as it only matters if the estimated positions are moving away from each other or moving towards each other.

FIG. 8 shows a similar setup as FIG. 7, but without frame electrodes. Instead the four outermost electrodes 730, 740, 750, and 760 of the 2D grid 710 are used as 'preferred' GestIC® electrodes for 3D operation, i.e. they are not multiplexed. Rather these electrodes 730, 740, 75-, and 760 of the outer rows and columns of grid 710 separately connected such that they can be used similar to the electrodes 110, 120, 130, and 140 as shown in FIG. 7 with the solid lines whereas the remaining inner electrodes can be multiplexed. Other matrix arrangements with a grid of electrodes can be used and controlled that similar electrodes 730, 740, 750 and 760 as shown in FIG. 8 are formed. FIG. 8 also shows a connected 2D/3D controller which may operate in two modes to perform touch detection and non-touching gesture detection.

Hence the preferred electrodes in these type of embodiments are part of the—possibly regular—2D grid 710, used for 2D positioning. In order to obtain measurements from the preferred electrodes for touch detection which have the same sampling conditions as the grid's inner electrodes which are time-multiplexed and hence do have less sampling time each, parts of the continuously sampled preferred electrodes' samples can be discarded for 2D positioning. It is also possible to select other but the outermost electrodes as preferred ones.

Figure 9:
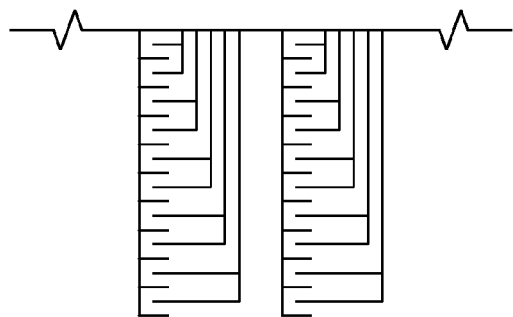
FIG. 9 shows an excerpt of a 2D touch design for single-side electrode connection.

FIG. 9 shows an excerpt of a 2D touch design where the electrode connectors are located only on one layer (here: top).

The signals obtained from the 2D grid's electrodes can not only be used for detecting a touching finger, but also for detection of a non-touching hovering finger.

Mode-Multiplexing

Figure 10:
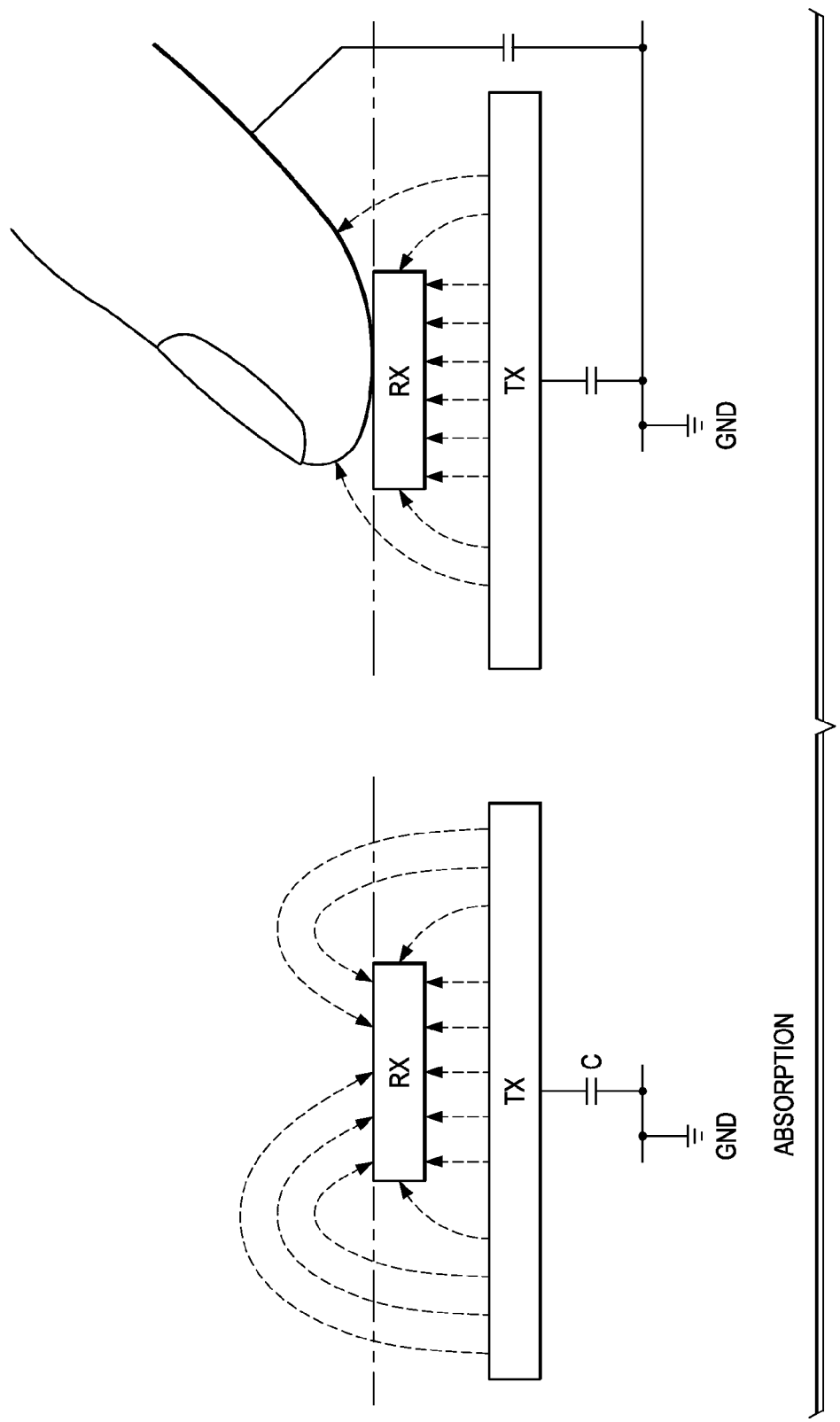
FIG. 10 shows signal Absorption with a strong base coupling between Tx and Rx electrode.
Figure 11:
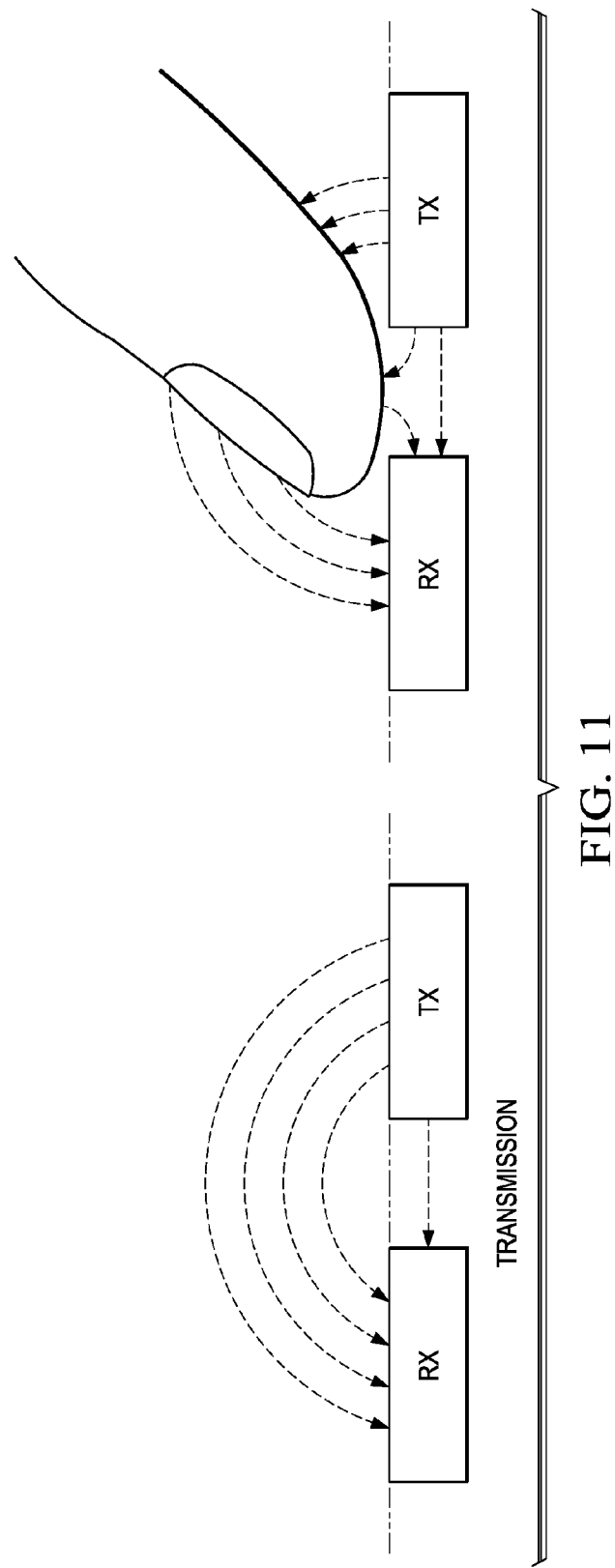
FIG. 11 shows signal transmission with a weak base coupling between Tx and Rx electrode.

The self-capacitance measurement effect is based on the change of the capacitance between Rx and GND when a finger is approaching and is increasing the capacitance. The Rx signal and input voltage will decrease in this case. (For very rare electric potentials on and coupling conditions between the finger and the sensor system, the Rx input voltage can also increase here, in which case all voltage changes in this section would be inverted.) The mutual-capacitance measurement effect is based on a change of the capacitance between Tx and Rx. Depending on the system and electrode setup the approaching finger is increasing the coupling (transmission effect) or reducing the coupling (absorption effect). FIG. 10 shows an electrode setup with strong base coupling between Rx and Tx and a small stray field compared to the base coupling. The approaching finger will not influence the base coupling but will reduce the stray field between Tx and Rx. The signal and the input voltage will decrease in this case. Combined with the self-measurement effect this will result in a decreased signal upon a touch event. This is the first mode, with getting a reduced signal applying a touch. FIG. 11 shows an electrode setup with small base coupling between Rx and Tx electrodes. With a touch event the finger will increase the coupling between Rx and Tx electrodes. This will result in an increased signal and input voltage. As long as the mutual-capacitance measurement with this transmission effect is dominant against the self-measurement effect this will result in an increased over-all signal and input voltage. This is the second mode, with getting an increased signal and input voltage.

Figure 12:
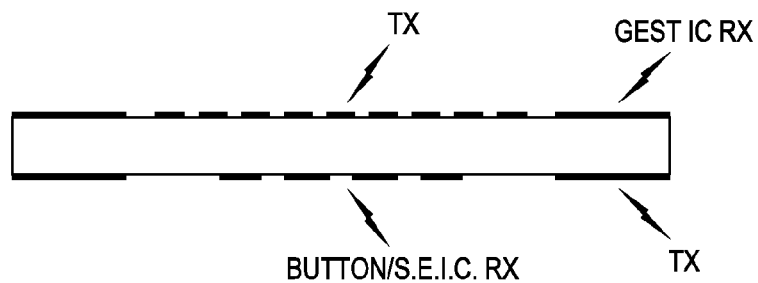
FIG. 12 shows a cross-section view of a GestIC® frame with four buttons (Rx in bottom layer) operated in transmission mode.

FIG. 12 shows the cross section of an example where the touch Rx electrodes are placed in the bottom layer underneath a hedged Tx electrode. FIG. 12 shows four buttons (Rx in bottom layer) operated in transmission mode.

Assuming that the absorption effect causes the measurement signal to change in one direction upon approach of a finger, and that the transmission effect causes the measurement signal to change in the opposite direction, then the all-over signal deviation is depending on the combined self-measurement and mutual-measurement effect whereby the mutual part is either absorption or transmission effect dominant. The dominance is given by the sensor layout. It is thus possible to use one Tx and one Rx channel and still be able to distinguish (in software) touches in two different positions, if in one position the electrodes are designed for dominating absorption mode, and in the other—possibly neighboring—position for dominating transmission mode.

Figure 13:
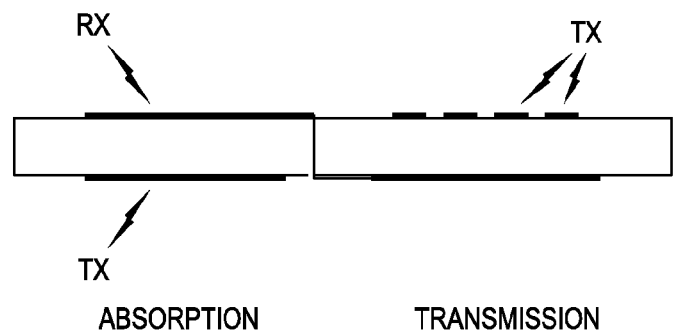
FIG. 13 shows mode-multiplexing.

In the following, this type of multiplexing will be referred to as mode-multiplexing. An example sensor layout with two touch positions is shown in FIG. 13 (cross-section of PCB). On the left side, the Rx electrode is in the top layer for dominant absorption mode, on the right side the Tx electrode is in the top layer and the Rx electrode in the bottom layer. The Tx electrode must not shield the Rx electrode from the touching finger, hence in the figure it is depicted as a meshed electrode. For mode-multiplexing, depending on the touch position, absorption mode or transmission mode is dominant, causing the sensor signal to deviate in one or the other direction upon touch.

Figure 14:
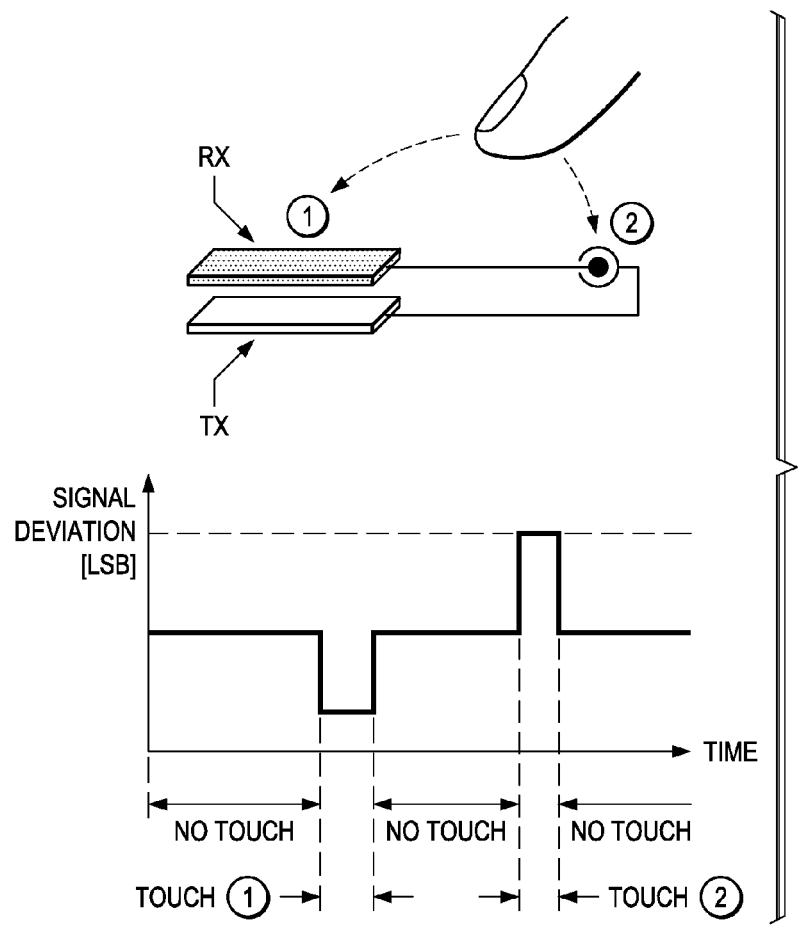
FIG. 14 shows an Rx electrode for making use both of absorption effect (1) and transmission effect (2).

FIG. 14 (top) gives another example for a mode-multiplexing sensor layout. For the left part of the electrode (1) with Rx electrode on top of Tx electrode, the absorption effect is dominant as the Rx electrode is placed between Tx and finger, while for the right part of the electrode the transmission effect is dominant as Rx and Tx electrode are in the same layer, the Tx electrode 'grabbing' around the Rx electrode. In the bottom of the figure, the Signal Deviation is shown over the time, where first the left part (1) of the electrode is touched, and then the right part (2), causing the Signal Deviation to change in opposite directions.

Applying mode-multiplexing to Rx channels does virtually allow to double the number of possible touch channels. For example, with the five GPIOs of MGC3130, a 32:1 analog multiplexer with 32 physical channels, together with mode-multiplexing on each of the sub-channels, the total number of virtual touch channels is 32*2=64.

Mode-multiplexing can be applied to any (sub-)channel, including the continuously sampled preferred channels. For example, a touch sensor layout designed for dominant transmission mode can use the same Rx and Tx channel as a preferred electrode for 3D measurements.

Time-Multiplexed Transit Signal

It is also possible to apply time-multiplexing to the Tx channel with several Tx electrodes. In this case a multitude of touch electrodes share the same Rx channel, but have different Tx channels.

As by definition time-multiplexed Tx electrodes are not permanently in floating state, charges may remain on a Tx electrode after having excited by the Tx signal (i.e. after having been addressed by the MUX). These charges can drift away which may lead to unwanted transients on Rx signals. Possible countermeasures are to bring the charge of a Tx electrode to a neutral value before putting it to floating state after Tx operation (e.g. by putting it onto a mid voltage), or to drive all Tx electrodes with the Tx signal, but one electrode (or a sub-set of electrodes) with an inverse Tx signal, and to evaluate the Rx measurement signal accordingly. The not driven Tx channel may also be set to a defined, static electrical potential during the measurement.

An advantage of time-multiplexing of the Tx channel as opposed to an Rx channel is that it can be done with a digital MUX, which is typically cheaper than an analog MUX. A disadvantage is that time-multiplexing of the Tx signal onto different Tx electrodes does affect the excited E-field, which can affect the highly sensitive measurements of the preferred electrodes in a negative way. This may be compensated for with appropriate timing of the Tx multiplexing.

Figure 15:
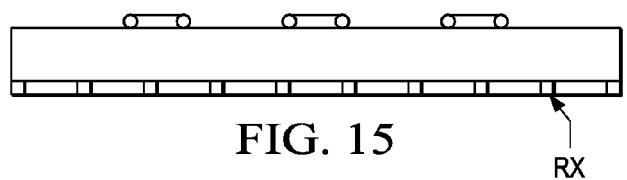
FIG. 15 shows Tx-Multiplexing (transmission mode).

FIG. 15 shows the cross-section of a sensor layout with three time-multiplexed Tx electrodes in the top layer, and a single large Rx electrode in the bottom layer. The large Rx electrode in the bottom layer is meshed, and ring or small Tx electrodes are in top layer. The influence of the finger onto the Rx-GND capacitance (as obtained with self-measurement) is reduced by moving the Rx electrode to the bottom layer.

Figure 16:
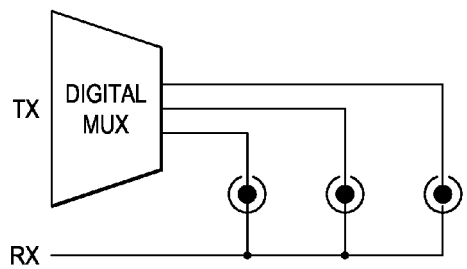
FIG. 16 shows a single-layer design to operate buttons in transmission mode.

FIG. 16 shows another example with a single-layer design with three buttons to be operated in transmission mode. Here all receiving electrodes are connected to each other. However, each receiving electrode has a dedicated transmission electrode. The receiving electrodes may be, for example, ring shaped and surround each associated transmission electrode, respectively. The multiplexer can be either an analog or a digital multiplexer comprising a single input and a plurality of outputs connected to the transmission electrodes.

Code-Division Multiplexing

Figure 17:
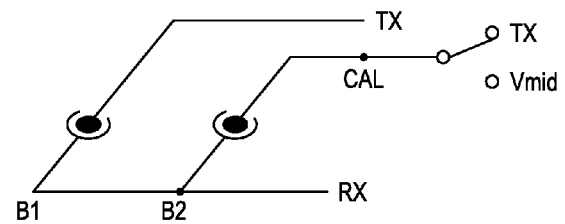
FIG. 17 shows Code-Division Multiplexing with one Rx channel.

Code-division multiplexing is a spread spectrum technique which allows multiple usage of the same channel. Knowing the code, the receiver can distinguish the information from different sources. For example, MGC3130 has a CAL pin which can be put either on the Tx signal or on a mid-voltage Vmid. FIG. 17 shows an example layout for doing code-division multiplexing with one Rx electrode which may comprise multiple connected segments. While a finger on button B1 always increases both the capacitance Rx-F between Rx electrode and finger and the capacitance Rx-Tx between Rx and Tx electrode, a finger on Button B2 does equally so only when CAL is on Tx signal. But when CAL is on Vmid the finger does not affect the Rx-Tx capacitance, and hence the change of the signal level measured on the Rx channel when a finger is on B2 depends on the CAL state. In contrast, a finger on button B1 will also change the Rx signal level, but theoretically independent of the CAL state.

Combination of Multiplexing Schemes

Figure 18:
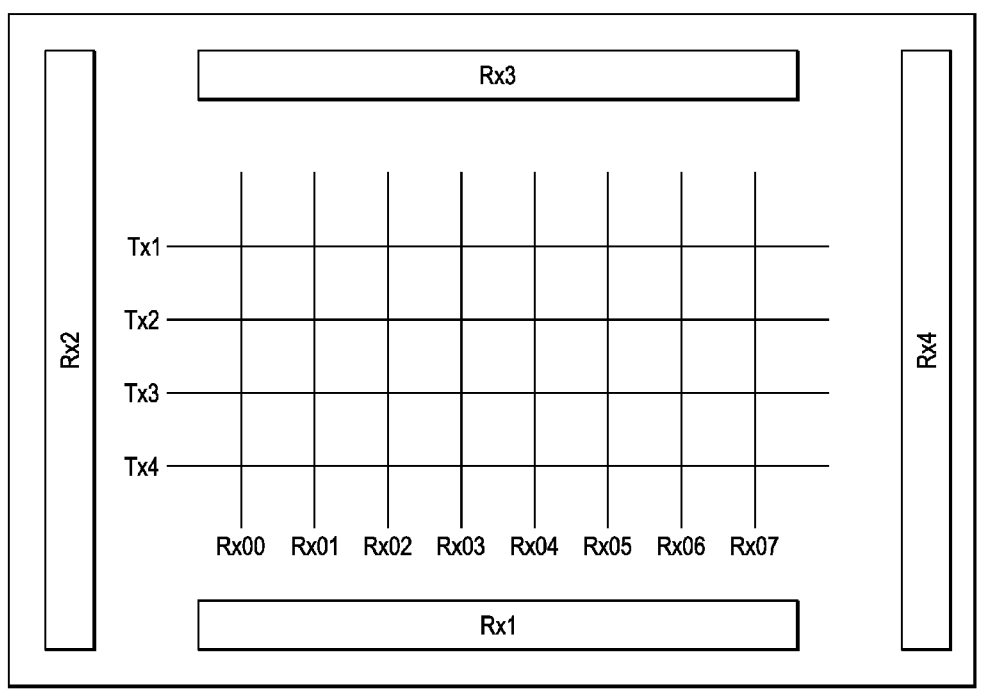
FIG. 18 shows 3D Frame Electrodes plus 2D Touch Grid for Mutual Capacitance Measurements.

It is possible to combine Rx time-multiplexing and/or Tx time-multiplexing and/or mode-multiplexing. FIG. 18 shows an example sensor arrangement for usage with MGC3130 and its five GPIOs. Four frame electrodes Rx1 to Rx4 for 3D gesture recognition and position tracking, to be directly connected to four of the MGC3130's Rx input channels, and eight vertical grid electrodes Rx00 to Rx07 to be multiplexed to the fifth Rx input channel using an eight-channel analog multiplexer (controlled by 3 GPIOs). The four horizontal Tx grid lines Tx1 to Tx4 are multiplexed to the Tx signal using either an analog or a digital four-channel multiplexer (controlled by 2 GPIOs). A large, continuously driven Tx electrode underneath the frame electrodes or the whole sensor arrangement is not shown for simplicity. The grid of horizontal Tx and vertical Rx electrodes allows for mutual capacitance measurements, and hence for multi-finger detection and tracking.

Capacitively Coupled Electrodes

A capacitive sensor electrode does not necessarily need to be galvanically coupled to a Tx/Rx channel or the corresponding feeding lines. Depending on the application, capacitive coupling will suffice.

Applications

The features covered by the proposed system setup using a gesture detection device such as the MGC3130 manufactured by the Assignee of the present disclosure are:

Capacitive buttons, sliders and/or touch panels with moderate requirements for response time and local resolution, 3D gesture detection and position tracking, Any feature provided by current/state-of-the-art touch devices using self-capacitance measurements, including
  Single-finger tracking,
  Pinch/zoom (ghost points do not matter here, it only matters that the points move towards each other, or away from each other), The sensor board can be a display glass, (flex) PCB, any other dielectric or not electrically conductive material, Multitude of virtual discrete buttons by quantizing the continuous 2D position estimated using a 2D touch grid.

Areas of Application

The various embodiments according to the present disclosure may include household, automotive, industrial, consumer electronics, medical or hygienic appliances. For example, such a device may be used in a household appliance such as a coffee machine with touch sensitive button selection and non-touch gesture detection such as an "Air-Wheel" which detects a circular motion by a finger in the air to replace the mechanical wheel for selecting the coffee's strength. Any type of increasing/decreasing control can be performed by such a non-touching gesture, including volume, speed, etc. The touch functionality may include numeric keypads. Other consumer electronics may include eBook reader or any other mobile device. Any other application which currently is already using capacitive or mechanical buttons and can be feature-improved using 3D gestures wherein the touch function is embodied as described above.

The invention claimed is:

1. A system comprising a three-dimensional (3D) gesture detection integrated circuit device with a plurality of input pins and an output pin and comprising a 3D gesture controller unit, wherein the 3D gesture controller unit does not comprise a controller dedicated to detect a touch, wherein the 3D gesture detection integrated circuit device uses an alternating electric near field generated through at least one transmission electrode coupled with the output pin and wherein each of the input pins of the 3D gesture detection integrated circuit device is configured to be connected with a 3D sensor receiving electrode for sensing the alternating electric near field, wherein some of the input pins are coupled with 3D sensor receiving electrodes of the system such that one of the input pins is not connected with any of the 3D sensor receiving electrodes, the system further comprising a plurality of touch electrodes, wherein the one of the input pins of the 3D gesture detection integrated circuits device is coupled to at least one of the plurality of touch electrodes through multiplexing, wherein the 3D sensor receiving electrodes and a selected touch electrode sense the alternating electric near field generated by the transmission electrode and wherein the 3D gesture controller unit is configured to process signals received from the 3D sensors to determine 3D position information and applies a threshold to the signal received at the one of the input pins to determine a touch.

2. The system according to claim 1, wherein multiplexing is a time division multiplexing with a time division multiple access scheme.

3. The system according to claim 2, wherein the time division multiple access scheme comprises different sub-modes comprising scheduled controlled, event-based controlled or carrier-sensing time division multiple access.

4. The system according to claim 1, wherein the 3D gesture detection integrated circuit device comprises a controller comprising one or more receiving multiplexers coupled with the touch electrodes and controlled to perform said multiplexing.

5. The system according to claim 1, wherein the 3D gesture detection integrated circuit device comprises a controller having general purpose input/output pins and the system further comprises one or more receiving multiplexers coupled with the touch electrodes and controlled through general purpose I/O pins of the 3D gesture detection integrated circuit device to couple one of the touch electrodes with one of the input channels.

6. The system according to claim 5, wherein the 3D gesture detection integrated circuit device comprises five input channels and wherein four input channels are connected to four receiving electrodes and the fifth input channel is coupled with an output of the receiving multiplexer.

7. The system according to claim 6, comprising a fifth receiving electrode coupled with one the receiving multiplexer inputs.

8. The system according to claim 1, wherein the 3D gesture detection integrated circuit device comprises a controller having general purpose input/output pins (GPIOs) and the system comprising one or more discrete analog multiplexers and one or more discrete digital multiplexers each coupled with the 3D gesture detection integrated circuit device which are controlled by GPIOs.

9. The system according to claim 8, further comprising a plurality of transmission electrodes wherein the controller comprises one output channel coupled with an input of the digital multiplexer, wherein the transmission electrodes are coupled with outputs of the digital multiplexer, and wherein the touch electrodes are coupled with inputs of the analog multiplexers.

10. The system according to claim 1, wherein the touch electrodes comprise one or more touch button electrodes.

11. The system according to claim 1, wherein the touch electrodes comprise one or more touch segment electrodes arranged to form a slider electrode.

12. The system according to claim 1, wherein the receiving electrodes and the touch electrodes are arranged along a straight line.

13. The system according to claim 1, wherein the receiving electrodes and the touch electrodes are formed by electrode segments of touch detection electrode grid.

14. The system according to claim 1, wherein the touch electrodes are formed by electrode segments of touch detection electrode grid and the receiving electrodes are arranged around the touch detection electrode grid.

15. The system according to claim 14, wherein the touch electrode grid comprises electrode segments arranged in a single layer.

16. The system according to claim 14, wherein the touch electrode grid comprises electrode segments arranged in a single layer.

17. The system according to claim 1, wherein a touch electrode is arranged above a transmission electrode.

18. The system according to claim 1, wherein a touch electrode is arranged in the same layer as an associated transmission electrode and adjacent to the associated transmission electrode.

19. The system according to claim 1, wherein a touch electrode is arranged under a transmission electrode.

20. The system according to claim 19, wherein the transmission electrode is a meshed electrode.

21. The system according to claim 20, wherein the receiving electrodes are arranged in the same layer as the meshed transmission electrode.

22. The system according to claim 21, further comprising an additional transmission electrode arranged under the receiving electrodes.

23. The system according to claim 1, wherein a touch electrode comprises a first segment is arranged in the same layer as an associated transmission electrode and a second segment arranged under the transmission electrode.

24. A system comprising a three-dimensional (3D) gesture detection integrated circuit device with a plurality of input pins and an output pin and comprising a 3D gesture controller, wherein the 3D gesture controller unit does not comprise a controller dedicated to detect a touch, wherein the 3D gesture detection integrated circuit device uses an alternating electric near field generated through at least one 3D transmission electrode coupled with the output pin, wherein some of the input pins of the 3D gesture detection integrated circuit device are coupled with 3D receiving electrodes, the system further comprising a plurality of transmitting touch electrodes associated with a receiving touch electrode coupled with an input pin, wherein the output pin of the 3D gesture detection integrated circuits device is coupled with at least one of the plurality of transmitting touch electrodes through multiplexing, wherein the receiving touch electrode sense an alternating electric near field generated by a selected transmitting touch electrode and wherein the 3D gesture controller is configured to process signals received from the 3D sensors without using a touch controller to determine 3D position information and applies a threshold to the signal received at the receiving touch electrode to determine a touch.

25. The system according to claim 24, wherein the 3D gesture detection integrated circuit device comprises a controller having general purpose input/output pins (GPIOs) and the system further comprises one or more discrete transmission multiplexers coupled with the 3D gesture detection integrated circuit device which are controlled by the GPIOs.

26. The system according to claim 25, wherein the transmission multiplexer is a digital multiplexer.

27. The system according claim 24, wherein the 3D gesture detection integrated circuit device comprises one or more internal transmission multiplexers.

28. A method for operating a three-dimensional (3D) gesture detection integrated circuit detection device comprising a 3D gesture controller, wherein the 3D gesture controller unit does not comprise a controller dedicated to detect a touch, using an alternating electric near field and comprising at least one 3D transmission electrode and a plurality of input pins, the method comprising the steps of:
coupling some of the input pins of the 3D gesture detection integrated circuit device with 3D receiving electrodes wherein one input pin of the 3D gesture detection integrated circuits device is not connected to any of the 3D receiving electrodes, and
multiplexing a plurality of touch electrodes using a multiplexer, wherein the multiplexer is controlled to couple at least one selected touch electrode with the one input pin not connected to any of the 3D receiving electrodes
generating an alternating electric near field,
sensing the alternating electric near field with the 3D receiving electrodes and the at least one selected touch electrode,
determining 3D position information from signals received from the 3D receiving electrodes by a 3D gesture controller, and
applying a threshold to the signal received from the selected touch electrode by the 3D gesture controller without using a separate touch controller to determine a touch at the selected touch electrode.

29. The method according to claim 28, wherein multiplexing is time division multiplexing with a time division multiple access scheme.

30. The method according to claim 29, wherein the time division multiple access scheme comprises different sub-modes comprising scheduled controlled, event-based controlled or carrier-sensing time division multiple access.

31. The system according to claim 28, wherein the touch electrodes comprise one or more touch segment electrodes arranged to form a slider electrode.

32. The method according to claim 28, wherein the receiving electrodes and the touch electrodes are arranged along a straight line.

* * * * *